(12) United States Patent
Kim et al.

(10) Patent No.: US 8,861,645 B2
(45) Date of Patent: *Oct. 14, 2014

(54) DIGITAL BROADCASTING TRANSMISSION AND RECEPTION DEVICES AND METHODS THEREOF

(75) Inventors: Joon-soo Kim, Seoul (KR); Eui-jun Park, Seoul (KR); Yong-deok Chang, Suwon-si (KR); Hae-joo Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/262,046

(22) Filed: Oct. 30, 2008

(65) Prior Publication Data

US 2009/0060097 A1 Mar. 5, 2009

Related U.S. Application Data

(63) Continuation of application No. 11/386,770, filed on Mar. 23, 3006.

(60) Provisional application No. 60/664,637, filed on Mar. 24, 2005.

(30) Foreign Application Priority Data

Mar. 8, 2006 (KR) .................................. 2006-21623

(51) Int. Cl.
*H03K 9/00* (2006.01)
*H04L 27/00* (2006.01)
*H04N 21/438* (2011.01)
*H03M 13/29* (2006.01)
*H03M 13/35* (2006.01)
*H04N 21/2383* (2011.01)
*H03M 13/25* (2006.01)
*H03M 13/00* (2006.01)

(52) U.S. Cl.
CPC ......... *H03M 13/256* (2013.01); *H04N 21/4382* (2013.01); *H03M 13/2936* (2013.01); *H03M 13/356* (2013.01); *H04N 21/2383* (2013.01); *H03M 13/6538* (2013.01)

USPC .......... 375/316; 375/295; 375/341; 375/354; 375/355

(58) Field of Classification Search
USPC .......................... 375/341, 295, 316, 354, 355
See application file for complete search history.

(56) References Cited

U.S. PATENT DOCUMENTS

| | | | |
|---|---|---|---|
| 2002/0001353 A1 * | 1/2002 | Citta et al. | 375/264 |
| 2002/0186790 A1 | 12/2002 | Choi et al. | |
| 2003/0079173 A1 | 4/2003 | Birru | |
| 2003/0099303 A1 * | 5/2003 | Birru et al. | 375/265 |
| 2004/0008642 A1 * | 1/2004 | Marko et al. | 370/321 |

(Continued)

FOREIGN PATENT DOCUMENTS

| | | |
|---|---|---|
| WO | WO 02/085014 | 10/2002 |
| WO | WO 2005/006749 | 1/2005 |

OTHER PUBLICATIONS

Samsung, Proposal for Enhancement of ATSC RF Transmission System (Revision to A/53), Sep. 16, 2004, Draft version 1.0, pp. 1-13.*

(Continued)

*Primary Examiner* — Chieh M Fan
*Assistant Examiner* — Freshteh N Aghdam
(74) *Attorney, Agent, or Firm* — Sughrue Mion, PLLC

(57) ABSTRACT

Digital broadcasting transmission and reception devices and methods thereof are provided. The digital broadcasting transmission device includes a randomizer which randomizes a dual transport stream including a normal stream and a robust stream, a supplementary reference signal inserter which inserts a certain supplementary reference signal into a stuffing region included in the randomized dual transport stream, a Reed-Solomon (RS) encoder which adds a parity into a parity region included in the dual transport stream, a robust processor which configures a new dual transport stream by convolution-encoding the robust stream among the dual transport stream, an interleaver which interleaves the configured dual transport stream, a trellis encoder which trellis-encode the interleaved dual transport stream, and a modulator which transmits the trellis-encoded dual transport stream. Accordingly, a sub-channel can be provided in which the robust data and the supplementary reference signal will be transmitted.

30 Claims, 11 Drawing Sheets

(56) References Cited

U.S. PATENT DOCUMENTS

| | | | |
|---|---|---|---|
| 2004/0057535 A1* | 3/2004 | Strolle et al. | 375/340 |
| 2005/0249301 A1 | 11/2005 | Jeong et al. | |
| 2006/0200853 A1* | 9/2006 | Simon | 725/118 |
| 2010/0246733 A1* | 9/2010 | Fu et al. | 375/341 |
| 2011/0083062 A1* | 4/2011 | Luis Vitorio et al. | 714/781 |
| 2011/0126077 A1* | 5/2011 | Park et al. | 714/755 |

OTHER PUBLICATIONS

Vasanth et al., A Newly Proposed ATSC DTV System for Transmitting a Robust Bit-Stream Along With the Standard Bit-Stream, IEEE, 2003, pp. 122-123.*

International Search Report issued on Jun. 22, 2006, in International Application No. PCT/KR2006/001073 (in English).

Written Opinion on the International Searching Authority issued on Jun. 22, 2006, in International Application No. PCT/KR2006/001073 (in English).

U.S. Appl. No. 11/386,770, filed Mar. 23, 2006, Joon-soo Kim et al., Samsung Electronics Co., Ltd.

U.S. Appl. No. 12/262,060, filed Oct. 30, 2008, Joon-soo Kim et al., Samsung Electronics Co., Ltd.

* cited by examiner

DIGITAL BROADCASTING TRANSMISSION AND RECEPTION DEVICES AND METHODS THEREOF

CROSS-REFERENCE TO RELATED APPLICATIONS

This application is a continuation of application Ser. No. 11/386,770 filed on Mar. 23, 2006, now pending, and claims the benefit of U.S. Provisional Application No. 60/664,637 filed on Mar. 24, 2005, and Korean Patent Application No. 2006-21623 filed on Mar. 8, 2006, in the Korean Intellectual Property Office. The disclosures of application Ser. No. 11/386,770, U.S. Provisional Application No. 60/664,637, and Korean Patent Application No. 2006-21623 are incorporated herein by reference in their entirety.

BACKGROUND OF THE INVENTION

1. Field of the Invention

Apparatuses and methods consistent with the present invention relate to digital broadcasting transmission and reception, and more particularly to digital broadcasting transmission and reception devices that can provide a sub-channel to transmit and receive robust stream, and methods thereof.

2. Description of the Related Art

Advanced Television System Committee (ATSC) Vestigial Sideband (VSB) system, which is an American terrestrial digital broadcasting system, is a single carrier system, and uses field sync with 312 segment units. Accordingly, this system has inferior reception performance in a deteriorated channel, particularly, in a Doppler fading channel.

FIG. 1 is a block diagram of a conventional ATSC VSB system, and FIG. 2 is a view illustrating a frame structure of a conventional ATSC VSB data.

FIG. 1 shows the Enhanced VSB (EVSB) system proposed by Philips Electronics, which forms and transmits a dual transport stream by adding robust data into normal data of a conventional ATSC VSB system.

A conventional digital broadcasting transmission process will be explained with reference to FIG. 1. A data randomizer 11 randomizes a dual transport stream, a Reed-Solomon (RS) encoder 12 adds a parity to the dual transport stream to correct errors, an interleaver 13 interleaves the RS encoded data, and a trellis encoder 14 trellis-encodes the interleaved data.

A MUX 15 inserts field sync and segment sync into the error correction coded data to multiplex the data, and a modulator 16 up-converts the data into a signal in an RF channel bandwidth to transmit it.

A conventional digital broadcasting reception process will be explained with reference to FIG. 1. As a tuner (not shown) down-converts the RF signal into a baseband signal, a demodulator 21 detects and demodulates the baseband signal, and an equalizer 22 compensates for a channel distortion.

Then, a Viterbi decoder 230 corrects errors and decodes symbol data, a deinterleaver 24 rearranges data distributed by the interleaver 13 of the transmitter, an RS decoder 25 corrects errors, and a de-randomizer 26 de-randomizes the error-corrected data to output MPEG-2 transmission stream.

FIG. 2 is a view illustrating a VSB data frame of ATSC VSB system, in which segment field sync and field sync are inserted. As can be seen from FIG. 1, one frame comprises two fields, and one field comprises one field sync segment and 312 data segments.

In the VSB data frame, one segment corresponds to one MPEG-2 packet, and one segment comprises four symbols for segment sync and 828 data symbols.

The segment sync and the field sync are used for synchronization and equalization of a digital broadcasting receiver. In other words, the segment sync and the field sync are already known data between the digital broadcasting transmitter and the digital broadcasting receiver, and are used as reference signals for the digital broadcasting receiver to perform equalization.

As described above, major problems of the conventional VSB system, which transmits and receives data over the air, are performance degradation in weak signal strength and dynamic multi-path interference. The conventional ATSC VSB system illustrated in FIG. 1 transmits a dual transport stream including robust data; however, it cannot be expected to improve degraded reception performance in a multi-path channel when the conventional VSB system transmits normal data stream. Additionally, there is no big improvement in the reception performance regarding robust stream in a multi-path environment.

SUMMARY OF THE INVENTION

The present invention has been developed in order to address the above drawbacks and other problems associated with the conventional arrangement. An aspect of the present invention is to provide digital broadcasting transmission and reception devices that provide a sub-channel in which robust data and a supplementary reference signal will be transmitted so that a reception performance can be improved in a dynamic multi environment, and methods thereof.

In order to achieve the above-described aspects and/or other features of the present invention, there is provided a digital broadcasting transmission device including a randomizer which randomizes a dual transport stream including a normal stream and a robust stream, a supplementary reference signal inserter which inserts a certain supplementary reference signal into a stuffing region included in the randomized dual transport stream, a Reed-Solomon (RS) encoder which adds a parity into a parity region included in the dual transport stream, a robust processor which configures a new dual transport stream by convolution-encoding the robust stream among the dual transport stream, an interleaver which interleaves the configured dual transport stream, a trellis encoder which trellis-encodes the interleaved dual transport stream, and a modulator which transmits the trellis-encoded dual transport stream.

The digital broadcasting transmission device may further include a compatible parity generator which generates a compatible parity on the basis of the dual transport stream to which the parity is added by the RS encoder and the dual transport stream which is trellis-encoded by the trellis encoder.

The trellis encoder may replace a portion of the parity added by the RS encoder, with the compatible parity to perform trellis-encoding of the interleaved dual transport stream.

The compatible parity generator may include a packet buffer which receives from the RS encoder the dual transport stream, to which the parity is added, and the interleaved dual transport stream trellis-encoded by the trellis encoder, and temporarily stores the parity-added dual transport stream and the trellis-encoded dual transport stream, and an RS re-encoder which generates the compatible parity on the basis of the parity-added dual transport stream and the trellis-encoded dual transport stream stored in the packet buffer.

The robust processor may include a robust interleaver which interleaves the robust stream among the dual transport stream, a robust encoder which performs convolution-encoding for the robust stream, and a processor Mux which multiplexes the convolution-encoded robust stream and the normal stream.

The digital broadcasting transmission device may further include a signal controller which generates a control signal to control the robust processor to perform the convolution-encoding for the robust stream.

The signal controller may include a bit signal generator which generates a normal bit signal and a robust bit signal, a convolution bit interleaver which performs convolution-interleaving for the generated normal bit signal and robust bit signal, and a trellis interleaver which performs trellis-interleaving for the convolution-interleaved normal bit signal and robust bit signal, and inputs an output signal to the trellis encoder.

In order to achieve the above-described aspects and/or other features of the present invention, there is provided a digital broadcasting transmission method including operations of randomizing a dual transport stream including a normal stream and a robust stream, inserting a supplementary reference signal into a stuffing region included in the randomized dual transport stream, adding a parity into a parity region included in the dual transport stream, configuring a new dual transport stream by convolution-encoding the robust stream among the dual transport stream, interleaving the configured dual transport stream, trellis-encoding the interleaved dual transport stream, and transmitting the trellis-encoded dual transport stream.

The digital broadcasting transmission method may further include operations of generating a compatible parity on the basis of the parity-added dual transport stream and the trellis-encoded dual transport stream.

In the operation of trellis encoding, a portion of the parity added by the RS encoder may be replaced with the compatible parity to perform the trellis-encoding.

The operation of configuring the new dual transport stream may include operations of interleaving the robust stream among the dual transport stream, performing convolution-encoding for the robust stream, and multiplexing the convolution-encoded robust stream and the normal stream to configure the new dual transport stream.

The operation of configuring the dual transport stream may further include an operation of generating a control signal by which the robust stream can be convolution-encoded.

The operation of generating the control signal may further include operations of generating a normal bit signal and a robust bit signal, performing convolution-interleaving for the generated normal bit signal and robust bit signal, and performing trellis-interleaving for the convolution-interleaved normal bit signal and robust bit signal.

In order to achieve the above-described aspects and/or other features of the present invention, there is provided a digital broadcasting reception device including a demodulator which demodulates a dual transport stream including a normal stream and a robust stream, an equalizer which equalizes the demodulated dual transport stream, a robust decoder which Viterbi-decodes the equalized dual transport stream, a de-interleaver which de-interleaves the Viterbi-decoded dual transport stream, a recoverer which recovers the de-interleaved dual transport stream, an RS decoder which RS-decodes the recovered dual transport stream, and a de-randomizer which de-randomizes the RS-decoded dual transport stream.

The recoverer may include a robust decoder which performs a convolution decoding for the robust stream among the de-interleaved dual transport stream, and a robust deinterleaver which de-interleaves the convolution-decoded robust stream.

The recoverer may pass the normal stream as unchanged among the de-interleaved dual transport stream and perform the convolution decoding for the robust stream.

The digital broadcasting reception device may further include a control signal generator which generates a certain control signal to control the recoverer to perform the convolution decoding for the robust stream of the dual transport stream.

In order to achieve the above-described aspects and/or other features of the present invention, there is provided a digital broadcasting reception method including operations of demodulating a dual transport stream including a normal stream and a robust stream, equalizing the demodulated dual transport stream, Viterbi-decoding the equalized dual transport stream, de-interleaving the Viterbi-decoded dual transport stream, recovering the de-interleaved dual transport stream, RS-decoding the recovered dual transport stream, and de-randomizing the RS-decoded dual transport stream.

The operation of recovering may include operations of performing convolution-decoding for the robust stream among the de-interleaved dual transport stream, and deinterleaving the convolution-decoded robust stream.

The operation of recovering may pass the normal stream as unchanged among the de-interleaved dual transport stream and perform convolution-decoding for the robust stream.

The digital broadcasting reception method may further include an operation of generating a control signal to control the performing of the convolution-decoding for the robust stream of the dual transport stream during the recovering operation.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF THE EXEMPLARY EMBODIMENTS

Figure 1:
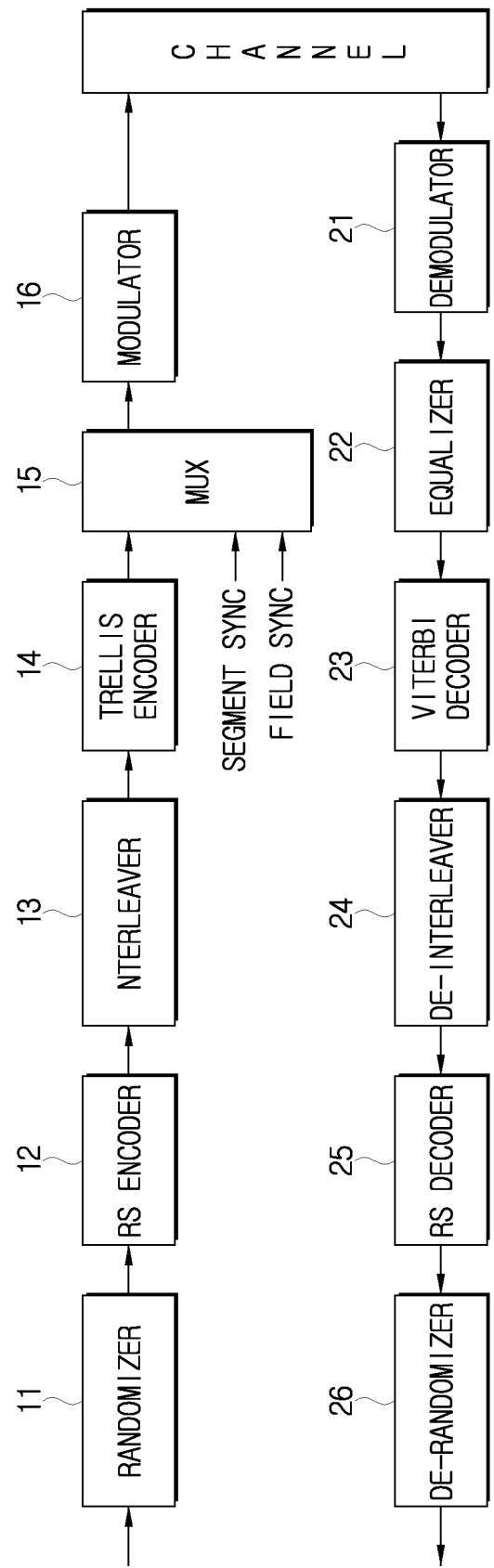
FIG. 1 is a block diagram of a conventional ATSC VSB system.
Figure 2:
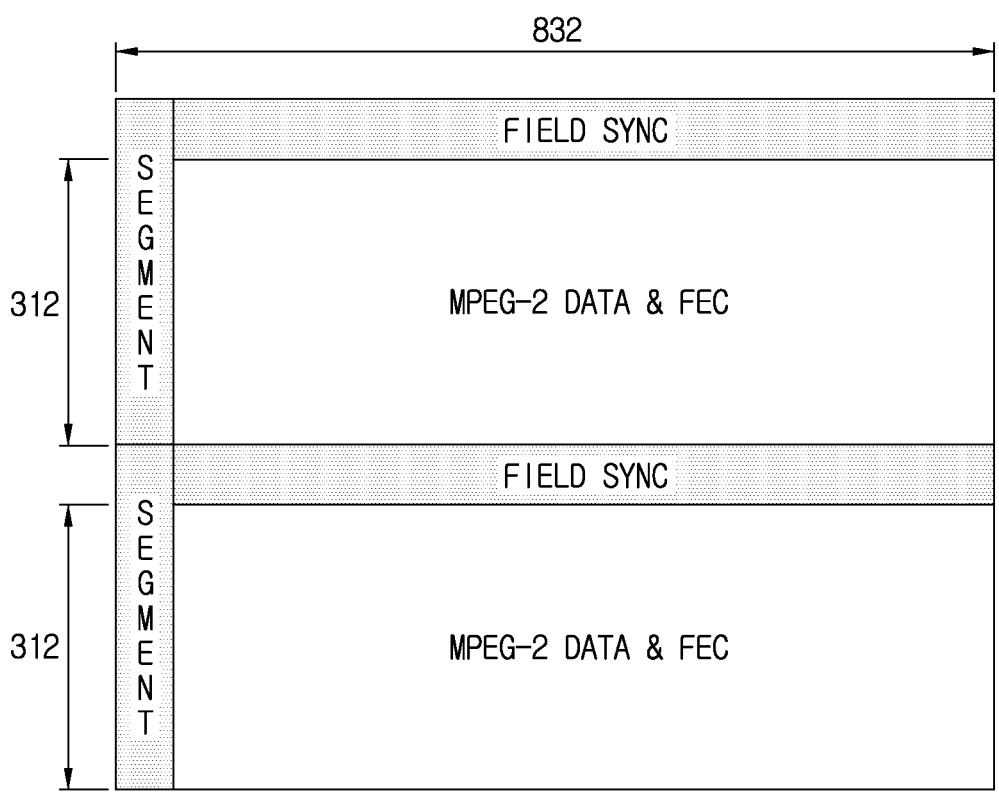
FIG. 2 is a view illustrating a frame structure of conventional ATSC VSB data.

Exemplary embodiments of the present invention will be described in detail with reference to the annexed drawings. In the drawings, the same elements are denoted by the same reference numerals throughout the drawings. In the following description, detailed descriptions of known functions and configurations incorporated herein have been omitted for conciseness and clarity.

Figure 3:
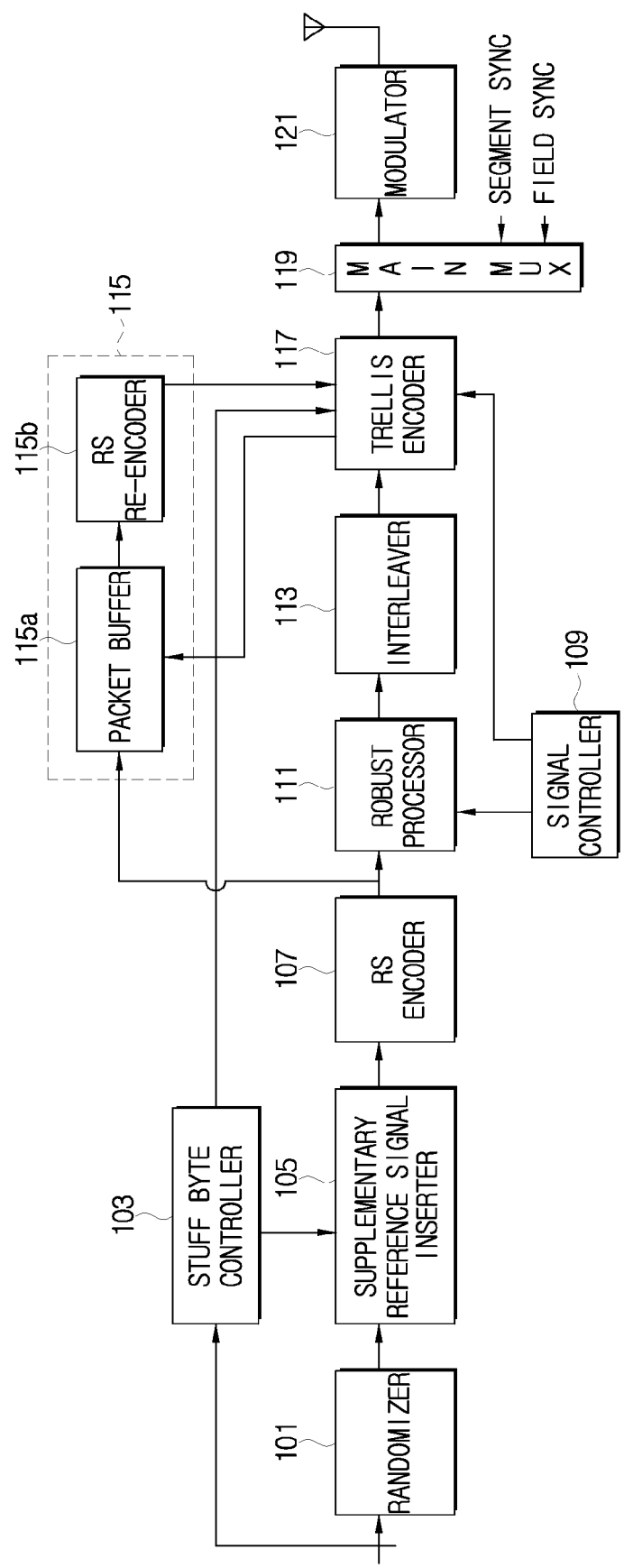
FIG. 3 is a block diagram of a digital broadcasting transmission device according to an exemplary embodiment of the present invention.

FIG. 3 is a block diagram of a digital broadcasting transmission device according to an exemplary embodiment of the present invention.

Referring to FIG. 3, a digital broadcasting transmission device according to an exemplary embodiment of the present invention comprises a randomizer 101, a stuff byte controller 103, a supplementary reference signal inserter 105, an RS encoder 107, a signal controller 109, a robust processor 111, an interleaver 113, a compatible parity generator 115, a trellis encoder 117, a main Mux 119, and a modulator 121.

The randomizer 101 randomizes a dual transport stream. The dual transport stream input into the randomizer 101 is formed by multiplexing a normal stream and a robust stream, and includes a stuffing region to insert a supplementary reference signal and a parity region to add a parity. The transport stream will be elucidated with reference to FIG. 4.

The stuff byte controller 103 controls the supplementary reference signal inserter 105 to insert a supplementary reference signal (hereafter referred to as "SRS") into the stuffing region included in a packet of the dual transport stream using a control signal.

If the randomized dual transport stream is input by the randomizer 101, the supplementary reference signal inserter 105 inserts the SRS into the stuffing region included in the packet of the dual transport stream under the control of the stuff byte controller 103. The SRS will be later elucidated with reference to FIGS. 5 and 6.

The RS encoder 107 adds a parity into the parity region included in the packet of the dual transport stream input by the supplementary reference signal inserter 105. The RS encoder 107 is provided in form of concatenated coder that adds the parity into the transport stream to correct errors that may be generated due to the channel feature during the transmission.

The signal controller 109 generates a certain control signal to control the robust processor 111 so that only a robust stream is controlled to be convolution-encoded, and transmits the generated control signal to the robust processor 111. The signal controller 109 will be elucidated later with reference to FIG. 9.

If the dual transport stream RS-encoded by the RS encoder 107 is received, the robust processor 111 passes a normal stream as unchanged among the received dual transport stream, and convolution-encodes only the robust stream so as to configure and output a new dual transport stream. At this time, the robust processor 111 can determine the normal stream and the robust stream by the control signal received from the signal controller 109. The robust processor 111 will be elucidated later with reference to FIG. 8.

The interleaver 113 interleaves the dual transport stream input by the robust processor 111. Here, the interleaving process does not refer to altering data but changing their positions within the data frame.

The compatible parity generator 115 generates a compatible parity on the basis of the packet of the dual transport stream to which the parity is added by the RS encoder 107 and the packet of the dual transport stream which is trellis-encoded by the trellis encoder 117. The compatible parity generator 115 comprises a packet buffer 115a and an RS re-encoder 115b.

The packet buffer 115a receives the packet of the dual transport stream to which the parity is added by the RS encoder 107 and the packet of the dual transport stream which is trellis-encoded by the trellis encoder 117 to temporarily store. Each packet of the dual transport stream stored in the packet buffer 115a is used when the RS re-encoder 115b generates the compatible parity.

The RS re-encoder 115b generates the compatible parity on the based of the packet of the dual transport stream stored in the packet buffer 115a and the packet of the dual transport stream which is trellis-encoded by the trellis encoder 117, and transmits the generated compatible parity again to the trellis encoder 117.

The trellis encoder 117 trellis-encodes the dual transport stream interleaved by the interleaver 113, and transmits the trellis-encoded dual transport stream to the packet buffer 115a to temporarily store. Then, if the compatible parity is received from the RS re-encoder 115b, the trellis-encoder 117 adds the compatible parity into the interleaved dual transport stream to output it.

The main Mux 119 adds segment sync and field sync into the dual transport stream to which the compatible parity is added by the trellis encoder 117 to perform multiplexing.

The modulator 121 performs channel modulating regarding the dual transport stream multiplexed by the main Mux 119, and converting the dual transport stream into a signal in an RF channel bandwidth to transmit the signal. Here, the converting the dual transport stream into the signal in the RF channel bandwidth refers to up-converting.

Figure 4A:
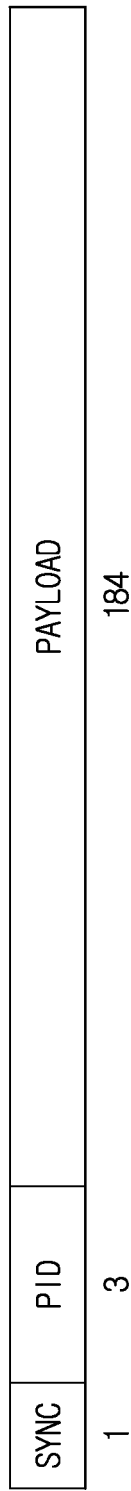
FIG. 4A-4C are a view exemplifying an MPEG transport stream.
Figure 4B:
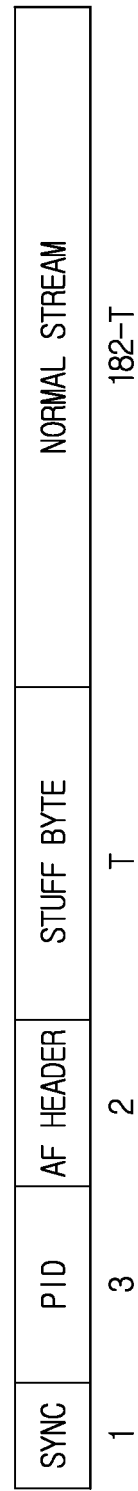
Figure 4C:
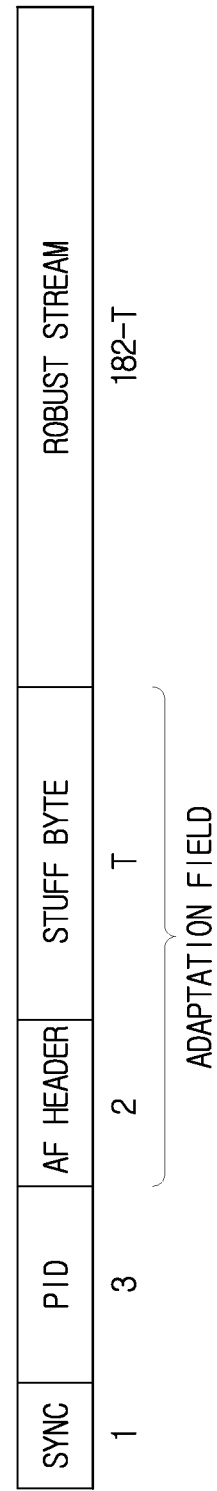

FIGS. 4A-4C are a view exemplifying an MPEG transport stream.

FIG. 4A shows a general MPEG packet, FIG. 4B shows a normal stream packet including an adaptation field, and FIG. 4C shows a robust stream packet including the adaptation field.

Referring to FIG. 4A, the general MPEG packet consists of 1 byte of sync, 3 bytes of header, and 184 bytes of payload. The header of the MPEG packet includes a packet identifier (PID).

Referring to FIG. 4B, the normal stream packet has the same structure as the general MPEG packet in that it includes 1 byte of sync and the PID of 3 bytes of header.

The adaptation field exists for the use of stuff bytes to adjust the size of packet while packetizing the transport stream, and contains 2 bytes of adaptation field (AF) header and T bytes of stuff byte. Here, the T bytes of stuff byte are a stuffing region in which the SRS will be inserted by the supplementary reference signal inserter 105.

In more detail, the normal stream packet including the adaptation field contains the header consisting of 1 byte of sync and 3 bytes of PID, the adaptation field consisting of 2 bytes of AF header and T bytes of stuff byte and the payload consisting of 182-T bytes of normal data.

Referring to FIG. 4C, the robust stream packet including the adaptation field has similar form to the normal stream packet including the adaptation field illustrated in FIG. 4B. In detail, the robust stream packet including the adaptation field consists of 1 byte of sync, 3 bytes of PID, 2 bytes of AF header, T bytes of stuff byte, and 182-T bytes of robust stream.

As described above, the normal stream and the robust stream including the adaptation field are constructed as the dual transport stream and input to the randomizer 101 of the digital broadcasting transmission device according to an exemplary embodiment of the present invention.

Figure 5:
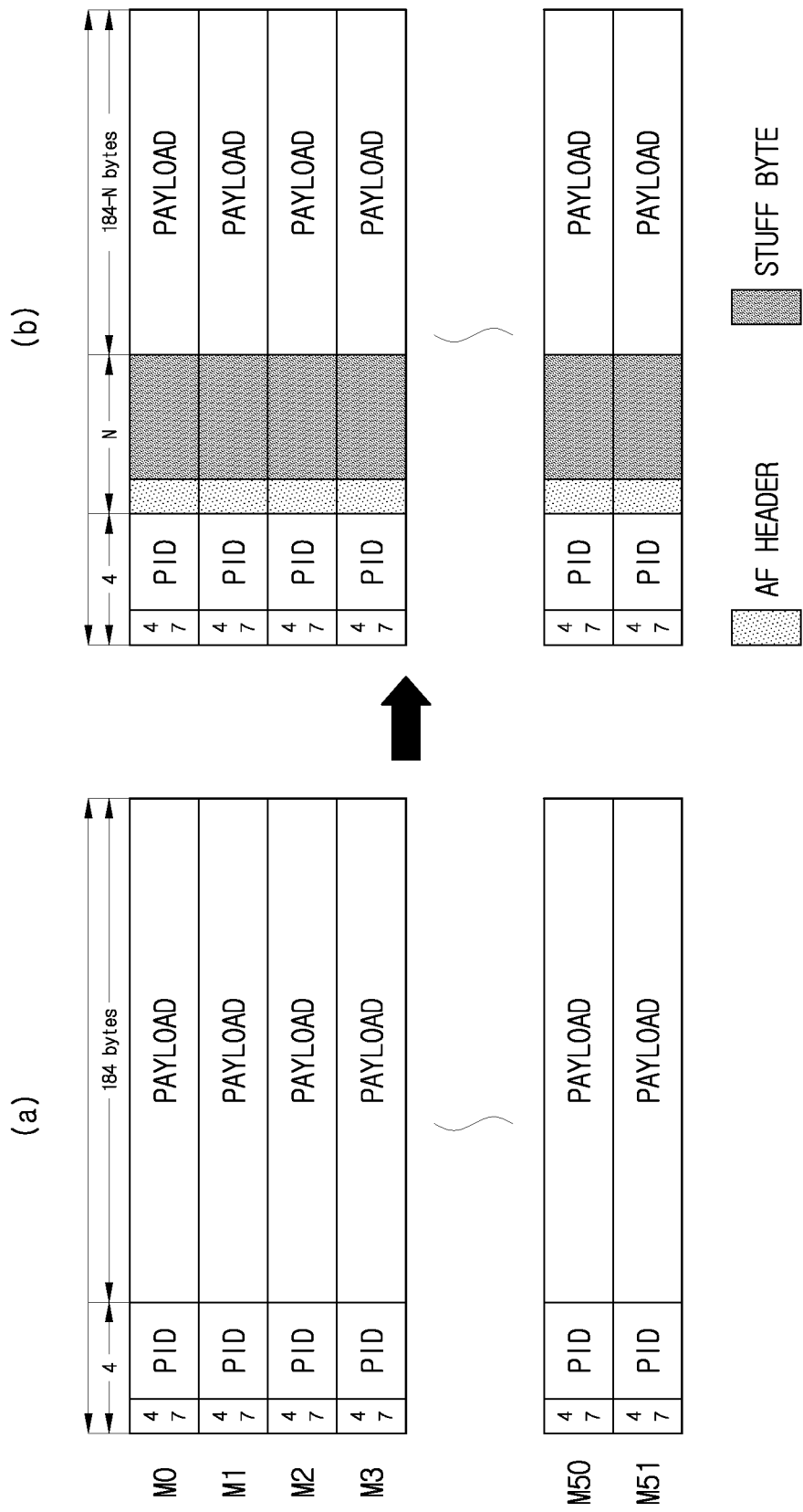
FIG. 5 is a view for explaining an exemplary stuff byte formed in an adaptation field.

FIG. 5 is a view for explaining an exemplary stuff byte formed in an adaptation field.

As shown in (a), if there are packets of M0 through M51, each packet is 188 bytes, and consists of 1 byte of sync, 3 bytes of PID and 184 bytes of payload.

The packets of (a) are converted into packets including an adaptation field to apply to a digital broadcasting transmission device according to an exemplary embodiment of the present invention. Accordingly, as shown in (b), the 188 bytes of packet are converted into those consisting of 1 byte of sync, 3 bytes of PID, N bytes of adaptation field, and 184−N bytes of payload. Additionally, the N bytes of adaptation field consist of 2 bytes of AF header and N−2 bytes of stuff byte.

In (a), the payload including the actual data is 184 bytes; however, in (b), the payload including the actual data is reduced to 184−N bytes since the packet contains the adaptation field. Due to the adaptation field, the amount of data included in the packet is reduced, but this may help the equalizer operation in a digital broadcasting reception device.

As can be seen from FIGS. 4 and 5, all the packets contain an adaptation field. Additionally, the number of bytes that can be used for a stuff byte is limited to maximum 26 bytes, and the loss of a payload due to SRS and the mix ratio can be determined by the insertion of an AF header and stuff bytes.

Figure 6:
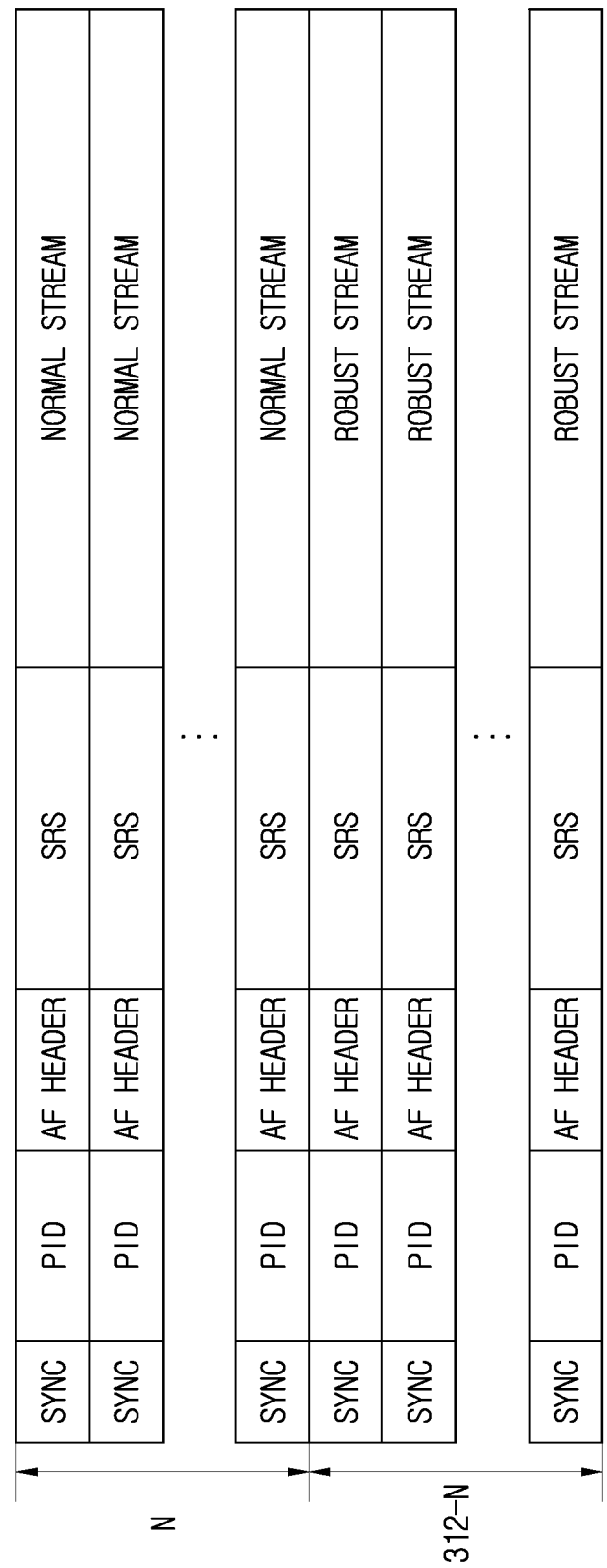
FIG. 6 is a view for explaining a dual transport stream structure according to an exemplary embodiment of the present invention.

FIG. 6 is a view for explaining a dual transport stream structure according to an exemplary embodiment of the present invention.

A dual transport stream according to an exemplary embodiment of the present invention contains a normal stream and a robust stream. As shown, N normal stream packets exist in front of the 312−N robust packets in 312 segments.

N normal stream packets and 312−N robust stream packets illustrated in FIG. 6 are converted to include an adaptation field of the structure illustrated in (b) of FIG. 5. The normal stream and the robust stream including an adaptation field are constructed as the dual transport stream to be input into the digital broadcasting reception device according to an exemplary embodiment of the present invention.

The dual transport stream input to the digital broadcasting reception device is randomized by the randomizer 101 and the stuff byte is converted into the SRS by the supplementary reference signal inserter 105 so as to have the structure illustrated in FIG. 6. Here, the amount and location of SRS is pre-determined.

Figure 7:
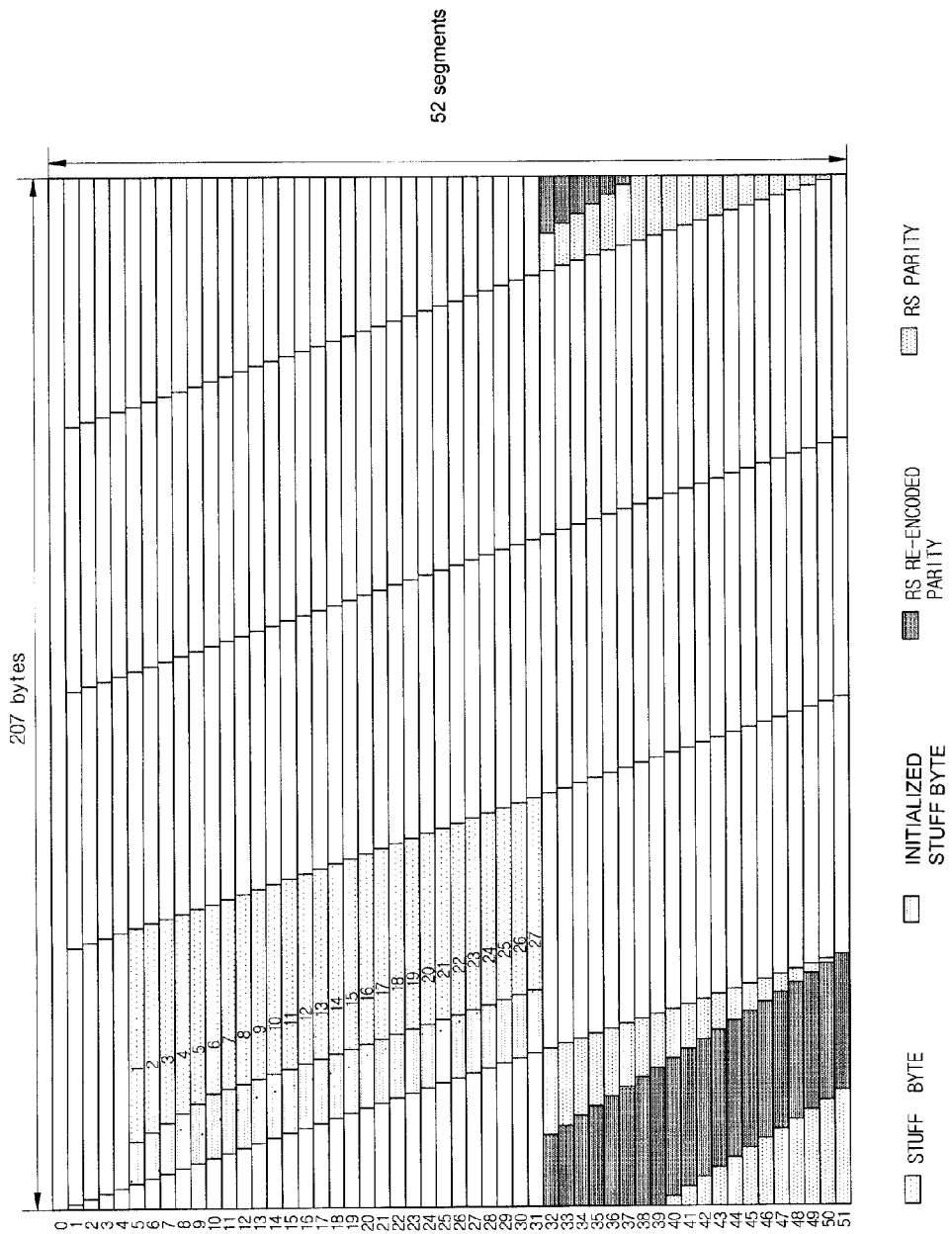
FIG. 7 is a view illustrating an exemplary interleaving result of a dual transport stream.

FIG. 7 is a view illustrating an exemplary interleaving result of the dual transport stream.

The RS encoder 107 adds 20 bytes of parity into each packet of the dual transport stream to form packets of 207 bytes. The packets of 207 are interleaved by the interleaver 113 to have the structure illustrated in FIG. 7. Data located in the same byte position before the interleaving appears contiguously after interleaving by the interleaver 113.

Figure 8:
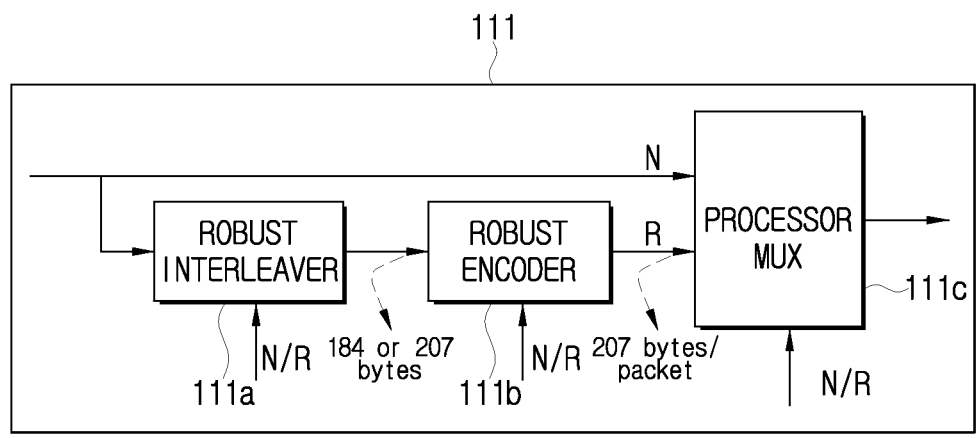
FIG. 8 is a block diagram of a robust processor illustrated in FIG. 3.

FIG. 8 is a block diagram of the robust processor illustrated in FIG. 3.

Referring to FIG. 8, the robust processor 111 of the digital broadcasting transmission device according to an exemplary embodiment of the present invention comprises a robust interleaver 111a, a robust encoder 111b, and a processor Mux 111c.

The robust interleaver 111a receives the RS-encoded dual transport stream from the RS encoder 107, and interleaves only the robust stream by the control signal of the signal controller 109. Here, the normal stream that is not input to the robust interleaver 111a by the control signal of the signal controller 109, is directly input to the processor Mux 111c.

The robust encoder 111b receives the robust stream interleaved by the robust interleaver 111a to perform convolution encoding, and transmits the convolution-encoded stream to the processor Mux 111c.

The processor Mux 111c multiplexes the normal stream, which is not processed by the control signal of the signal controller 109 but directly input, and the robust stream, which is convolution-encoded by the robust encoder 111b, to output the multiplexed streams.

Figure 9:
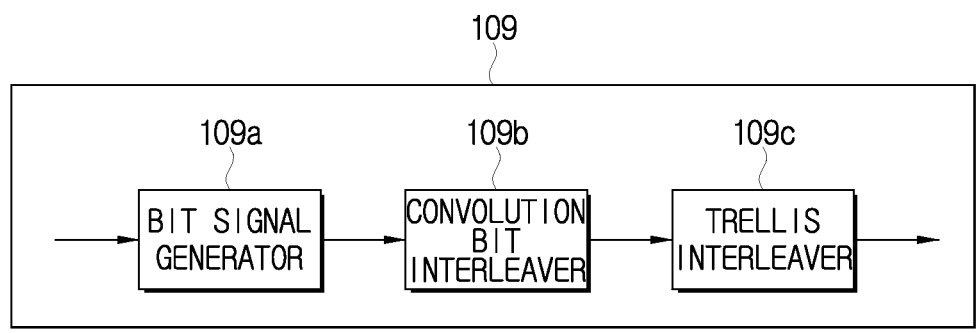
FIG. 9 is a block diagram of a signal controller illustrated in FIG. 3.

FIG. 9 is a block diagram of the signal controller illustrated in FIG. 1.

Referring to FIG. 9, the signal controller 109 of the digital broadcasting transmission device according to an exemplary embodiment of the present invention comprises a bit signal generator 109a, a convolution bit interleaver 109b, and a trellis interleaver 109c.

The bit signal generator 109a generates a normal bit signal and a robust bit signal. In detail, the bit signal generator 109a generates the control signal at packet level based on BCPBG and RPP parameters under the same mode as specified in the Modulation section of the ATSC Digital Television Standard, A/53.

Preferably, but not necessarily, the bit signal generator 109a may output "1" if the present packet belongs to the robust stream, and may output "0" if the present packet belongs to the normal stream.

The convolution bit interleaver 109b performs convolution interleaving regarding the normal bit signal and the robust bit signal generated by the bit signal generator 109a. Here, the bytes can be tracked through the convolution interleaving by the convolution bit interleaver 109b.

The trellis interleaver 109c performs trellis-interleaving regarding the normal bit signal and the robust bit signal convolution-interleaved by the convolution interleaver 109b. Preferably, but not necessarily, the trellis interleaver 109c consists of 12-symbol trellis interleaver.

The output of the trellis interleaver 109c may be "1" if the output symbol of the trellis encoder 117 belongs to the robust stream, and the output may be "0" if the output symbol of the trellis encoder 117 belongs to the normal stream.

Figure 10:
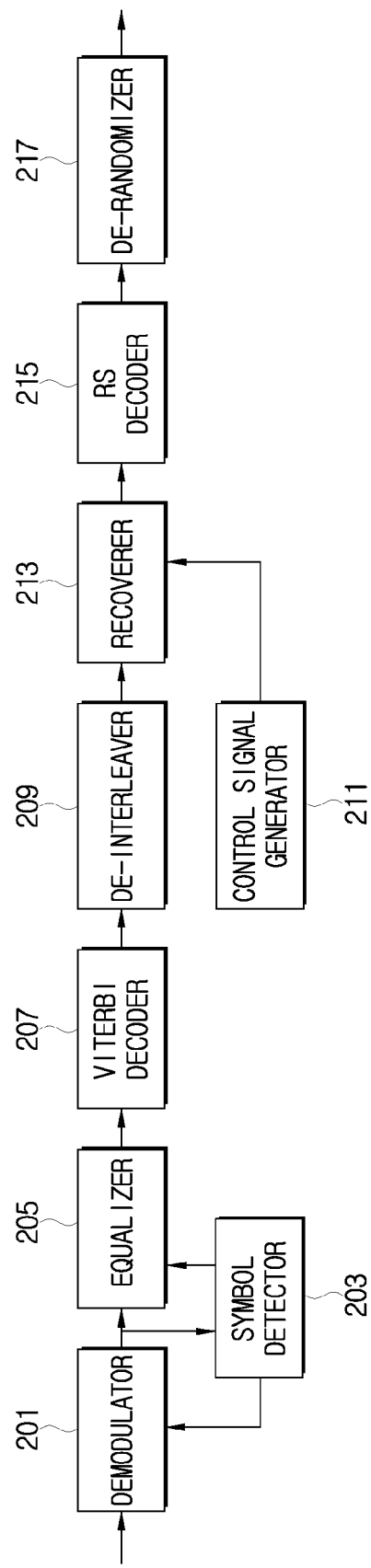
FIG. 10 is a block diagram of a digital broadcasting reception device according to an exemplary embodiment of the present invention.

FIG. 10 is a block diagram of a digital broadcasting reception device according to an exemplary embodiment of the present invention.

Referring to FIG. 10, the digital broadcasting reception device according to an exemplary embodiment of the present invention comprises a demodulator 201, a symbol detector 203, an equalizer 205, a robust decoder 207, a de-interleaver 209, a control signal generator 211, a recoverer 213, an RS decoder 215, and a de-randomizer 217.

The demodulator 201 receives and demodulates a dual transport stream transmitted from the digital broadcasting transmission device illustrated in FIG. 3. Here, the dual transport stream contains a normal stream and a robust stream.

The symbol detector 203 detects a known symbol location from the dual transport stream demodulated by the demodulator 201.

The equalizer 205 equalizes the dual transport stream demodulated by the demodulator 201. In other words, the equalizer 205 compensates for channel distortion of the dual transport stream in the multi-path of channel environment to remove mutual interference of received symbols.

The robust decoder 207 is a Viterbi decoder that performs Viterbi decoding regarding the dual transport stream equalized by the equalizer 205. The robust stream included in the dual transport stream can be used by the robust decoder 207.

The de-interleaver performs de-interleaving regarding the dual transport stream that is Viterbi-decoded by the robust decoder 207.

The control signal generator 211 generates a certain control signal to control the recoverer 213 to perform convolution decoding regarding only the robust stream included in the dual transport stream.

The recoverer 213 recovers the dual transport stream, which is de-interleaved by the de-interleaver 209, by the control signal of the control signal generator 211. To this end, although not shown, the recoverer 213 may include a robust decoder and a robust deinterleaver.

The robust decoder performs convolution decoding regarding only the robust stream among the dual transport stream that is de-interleaved by the de-interleaver 209. Here, the robust decoder can process only the robust stream by the control signal of the control signal generator 211.

The robust de-interleaver performs de-interleaving for the robust stream that is convolution-decoded by the robust decoder. According to this operation, the original MPEG data can be recovered.

The RS decoder 215 performs RS decoding for the dual transport stream recovered by the recoverer 213.

The de-randomizer 217 de-randomizes the dual transport stream that is RS-decoded by the RS decoder 215.

Figure 11:
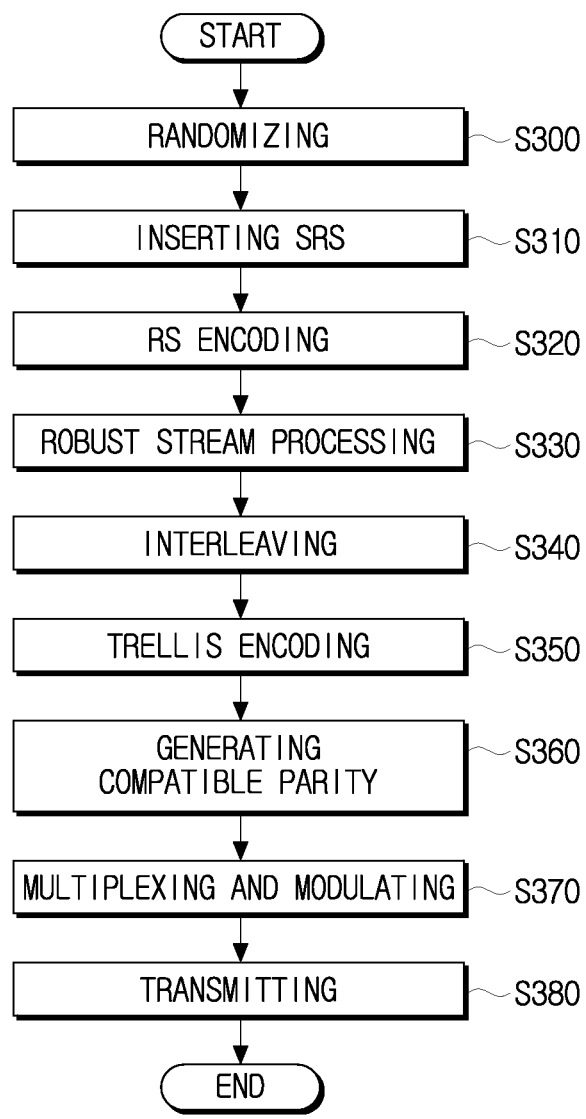
FIG. 11 is a flowchart for explaining a digital broadcasting transmission method according to an exemplary embodiment of the present invention.

FIG. 11 is a flowchart for explaining a digital broadcasting transmission method according to an exemplary embodiment of the present invention.

Referring to FIG. 11, the randomizer 101 receives the dual transport stream including the normal stream and the robust stream to perform a randomizing (S300).

After the randomizing, the supplementary reference signal inserter 105 inserts the SRS into the stuffing region included in the packet of the dual transport stream randomized by the randomizer 101. Here, the supplementary reference signal inserter 105 is controlled by the stuff byte controller 103 (S310).

If the dual transport stream, in which the SRS is inserted, is input, the RS encoder 107 performs an RS encoding to add the parity into the parity region included in the packet of the dual transport stream (s320).

The RS-encoded dual transport stream is input into the robust processor 111, and is processed in the robust processor 111 by the control signal of the signal controller 109. The normal stream passes through the robust processor 111 as unchanged among the dual transport stream, and the robust stream is interleaved and convolution-encoded so as to be configured as a new dual transport stream (S330).

The new dual transport stream configured by the robust processor 111 is interleaved by the interleaver 113 (S340), and trellis-encoded by the trellis encoder 117. Here, the trellis encoder 117 transmits the trellis-encoded dual transport stream to the compatible parity generator 115 (S350).

The compatible parity generator 115 generates the compatible parity on the basis of the packet of the dual transport stream RS-encoded by the RS encoder 107 and the packet of the dual transport stream trellis-encoded by the trellis encoder 117. The compatible parity generator 115 transmits the compatible parity to the trellis encoder 117 (S360).

Then, the trellis encoder 117 attaches the compatible parity received from the compatible parity generator 115 into the dual transport stream to transmit the stream to the main Mux 119. The main Mux 119 adds the segment sync and the field sync into the dual transport stream to perform multiplexing, and the modulator 121 modulates and outputs the multiplexed stream (S370 through S380).

Figure 12:
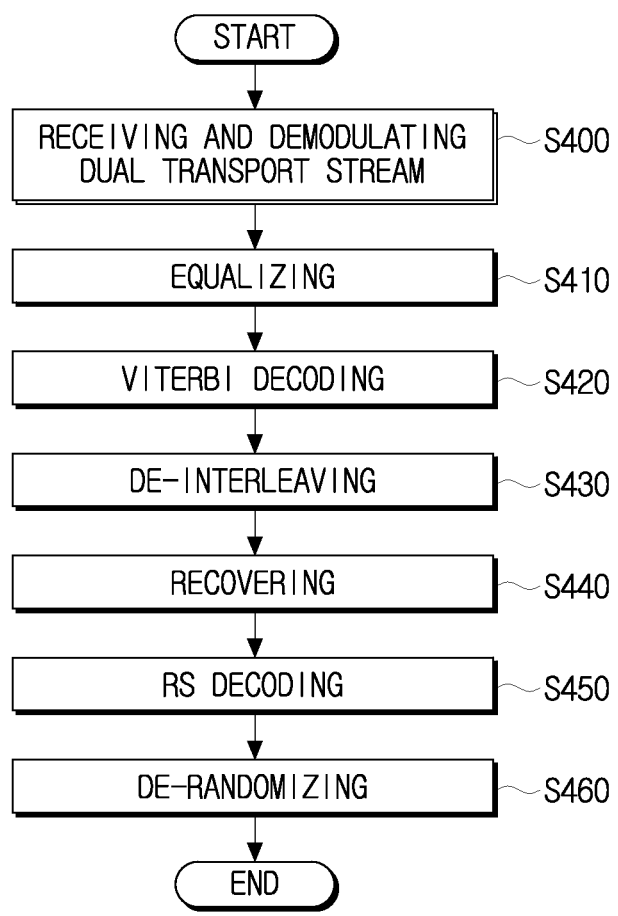
FIG. 12 is a flowchart for explaining a digital broadcasting reception method according to an exemplary embodiment of the present invention.

FIG. 12 is a flowchart for explaining a digital broadcasting reception method according to an exemplary embodiment of the present invention.

Referring to FIG. 12, when the dual transport stream is transmitted from the digital broadcasting transmission device, the demodulator 201 receives and demodulates the stream (S400).

The equalizer 205 equalizes the dual transport stream demodulated by the demodulator 201 (S410), the robust decoder 207 performs Viterbi decoding for the equalized dual transport stream (S420), and the de-interleaver 209 de-interleaves again the Viterbi-decoded dual transport stream (S430).

The dual transport stream de-interleaved by the de-interleaver is recovered by the recoverer 213. Here, the recoverer 213 passes the normal stream as unchanged among the dual transport stream, and performs convolution decoding only for the robust stream (S440).

The MPEG data recovered by the recoverer 213 is RS-decoded by the RS decoder 215 (S450), and is de-randomized and output by the de-randomizer 217 (S460).

As described above, the digital broadcasting transmission and reception devices and method thereof according to an exemplary embodiment of the present invention provide a sub-channel in which the robust data and the supplementary reference signal will be transmitted so that the reception performance can be enhanced in a dynamic multi environment. Furthermore, the pattern of continuous data can be used as a reference signal to help the equalizer operation.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A digital broadcasting system comprising:
   a demodulator to demodulate a transport stream comprising normal data, additional data and a known symbol;
   a symbol detector to detect a location of the known symbol from the demodulated transport stream; and
   an equalizer to equalize the demodulated transport stream using the known symbol;
   wherein the additional data is error-correction encoded at a transmission end,
   wherein the error-correction encoding of the additional data at the transmission end comprises interleaving the additional data and convolutional encoding the additional data,
   wherein the error-correction-encoded additional data is multiplexed with the normal data, which is not error-correction-encoded during the error-correction encoding of the additional data,
   wherein, before the transport stream is received for the demodulation at the demodulator, a parity is added to the transport stream and a compatibility parity is generated to replace the parity based on the transport stream to which the parity is added and which is trellis-encoded, and
   wherein an output of the symbol detector is provided to the demodulator and the equalizer.

2. The digital broadcasting system of claim 1, further comprising:
   a recoverer to recover the transport stream; and
   a control information generator to generate control information to control the recoverer.

3. A digital broadcasting system comprising:
   a demodulator to demodulate a transport stream comprising normal data and additional data if the transport stream is received; and an equalizer to equalize the demodulated transport stream;
wherein the additional data is error-correction encoded at a transmission end,
wherein the error-correction encoding of the additional data at the transmission end comprises interleaving the additional data and convolutional encoding the additional data,
wherein the error-correction-encoded additional data is multiplexed with the normal data, which is not error-correction-encoded during the error-correction encoding of the additional data,
wherein the digital broadcasting system further comprises:
a decoder to Viterbi-decode the transport stream equalized by the equalizer
a recoverer to recover the Viterbi-decoded transport stream; and
a control information generator to generate control information to control the recoverer.

4. The digital broadcasting system of claim 3, further comprising a deinterleaver to deinterleave the transport stream Viterbi-decoded by the robust decoder.

5. A stream processing method, comprising:
demodulating a transport stream comprising normal data, additional data and a known symbol;
detecting a location of the known symbol from the demodulated transport stream; and
equalizing the demodulated transport stream using the known symbol;
wherein the additional data is error-correction encoded at a transmission end,
wherein the error-correction encoding of the additional data at the transmission end comprises interleaving the additional data and convolutional encoding the additional data,
wherein the error-correction-encoded additional data is multiplexed with the normal data, which is not error-correction-encoded during the error-correction encoding of the additional data,
wherein, before the transport stream is received for the demodulating, a parity is added to the transport stream and a compatibility parity is generated to replace the parity based on the transport stream to which the parity is added and which is trellis-encoded, and
wherein an output of the symbol detecting is provided to the demodulating and the equalizing.

6. The stream processing method of claim 5, further comprising:
recovering the transport stream; and
generating control information to control the recovering of the transport stream.

7. A stream processing method, comprising:
demodulating a transport stream comprising normal data and additional data if the transport stream is received; and
equalizing the transport stream;
wherein the additional data is error-correction encoded at a transmission end,
wherein the error-correction encoding of the additional data at the transmission end comprises interleaving the additional data and convolutional encoding the additional data,
wherein the error-correction-encoded additional data is multiplexed with the normal data, which is not error-correction-encoded during the error-correction encoding of the additional data,
wherein the stream processing method further comprises:
Viterbi-decoding the equalized transport stream;
recovering the Viterbi-decoded transport stream; and
generating control information to control the recovering of the transport stream.

8. The stream processing method of claim 7, further comprising deinterleaving the Viterbi-decoded transport stream.

9. The digital broadcasting system of claim 1, wherein control information controls the normal data to bypass the error-correction encoding during the error-correction encoding of the additional data.

10. The digital broadcasting system of claim 1, wherein control information is subject to at least one of convolution-interleaving and trellis-interleaving.

11. The digital broadcasting system of claim 1, wherein the additional data is interleaved before and after the error-correction encoding.

12. The digital broadcasting system of claim 11, wherein the additional data is trellis-encoded after the interleaving applied after the error-correction encoding.

13. A digital broadcasting system comprising:
a demodulator to demodulate a transport stream comprising normal data, additional data and a known symbol;
a symbol detector to detect a location of the known symbol from the demodulated transport stream; and
an equalizer to equalize the demodulated transport stream;
wherein the additional data is error-correction encoded at a transmission end under control of control information provided to control processing of the additional data,
wherein the error-correction encoding of the additional data at the transmission end comprises convolutional encoding of the additional data,
wherein a parity is added to the transport stream,
wherein a compatibility parity is generated based on:
the transport stream to which the parity is added before the additional data is convolutional-encoded; and
the transport stream which is trellis-encoded after the additional data is convolutional-encoded, and
wherein an output of the symbol detector is provided to the demodulator and the equalizer.

14. The digital broadcasting system of claim 13, wherein the compatibility parity is generated by Reed-Solomon encoding.

15. The stream processing method of claim 3, wherein the control information controls the normal data to bypass the error-correction encoding during the error-correction encoding of the additional data.

16. The stream processing method of claim 3, wherein the control information is subject to at least one of convolution-interleaving and trellis-interleaving.

17. The stream processing method of claim 5, wherein the additional data is interleaved before and after the error-correction encoding.

18. The stream processing method of claim 17, wherein the additional data is trellis-encoded after the interleaving applied after the error-correction encoding.

19. A stream processing method, comprising:
demodulating a transport stream comprising normal data, additional data and a known symbol;
detecting a location of the known symbol from the demodulated transport stream; and
equalizing the demodulated transport stream;
wherein the additional data is error-correction encoded at a transmission end under control of control information provided to control processing of the additional data,
wherein the error-correction encoding of the additional data at the transmission end comprises convolutional encoding of the additional data,
wherein a parity is added to the transport stream,
wherein the compatibility parity is generated based on:
the transport stream to which the parity is added before the additional data is convolutional-encoded; and
the transport stream which is trellis-encoded after the additional data is convolutional-encoded, and wherein an output of the detecting is provided to the demodulating and the equalizing.

20. The stream processing method of claim 19, wherein the compatibility parity is generated by Reed-Solomon encoding.

21. A digital broadcasting system comprising:
a demodulator to demodulate a transport stream comprising normal data, additional data and a known symbol when the transport stream is received;
a symbol detector to detect a location of the known symbol from the demodulated transport stream;
an equalizer to equalize the demodulated transport stream;
a decoder to decode the equalized transport stream;
a recoverer to recover the decoded transport stream; and
a control information generator to generate control information to control the recoverer,
wherein the additional data is error-correction encoded at a transmission end,
wherein the error-correction encoding of the additional data at the transmission end comprises interleaving the additional data and convolutional encoding the additional data,
wherein the recoverer recovers the transport stream by decoding only the additional data among the normal and the additional data, and
wherein the error-correction-encoded additional data is multiplexed with the normal data, which is not error-correction-encoded during the error-correction encoding of the additional data, and
wherein, before the transport stream is received for the demodulation at the demodulator, a parity is added to the transport stream and a compatibility parity is generated to replace the parity based on the transport stream to which the parity is added and the transport stream which is trellis-encoded.

22. The digital broadcasting system of claim 21, wherein the recoverer deinterleaves the additional data after the decoding.

23. The digital broadcasting system of claim 22, wherein the recovering of the transport stream by the recoverer is performed after the transport stream is subject to another deinterleaving.

24. The digital broadcasting system of claim 23, wherein the recovering of the transport stream by the recoverer is performed before the transport stream is subject to a block decoding.

25. The digital broadcasting system of claim 24, wherein the block decoding comprises Reed-Solomon decoding of the transport stream.

26. A stream processing method comprising:
demodulating a transport stream comprising normal data, additional data and a known symbol;
detecting a location of the known symbol from the demodulated transport stream;
equalizing the demodulated transport stream;
decoding the equalized transport stream;
recovering the decoded transport stream; and
generating control information to control the recoverer,
wherein the additional data is error-correction encoded at a transmission end,
wherein the error-correction encoding of the additional data at the transmission end comprises interleaving the additional data and convolutional encoding the additional data,
wherein the recovering is performed by decoding only the additional data among the normal and the additional data, and
wherein the error-correction-encoded additional data is multiplexed with the normal data, which is not error-correction-encoded during the error-correction encoding of the additional data.

27. The stream processing method of claim 26, wherein the recovering the transport stream comprises deinterleaving the additional data after the decoding.

28. The stream processing method of claim 27, wherein the recovering the transport stream is performed after the transport stream is subject to another deinterleaving.

29. The stream processing method of claim 28, wherein the recovering of the transport stream by the recoverer is performed before the transport stream is subject to a block decoding.

30. The stream processing method of claim 29, wherein the block decoding comprises Reed-Solomon decoding of the transport stream.

* * * * *